United States Patent
Anderson

(10) Patent No.: US 10,568,197 B1
(45) Date of Patent: Feb. 18, 2020

(54) COMBINED HEAT SINK AND PHOTON HARVESTOR

(71) Applicant: Loon LLC, Mountain View, CA (US)

(72) Inventor: Kevin Anderson, Mountain View, CA (US)

(73) Assignee: LOON LLC, Mountainview, CA (US)

( * ) Notice: Subject to any disclaimer, the term of this patent is extended or adjusted under 35 U.S.C. 154(b) by 0 days.

(21) Appl. No.: 16/523,402

(22) Filed: Jul. 26, 2019

Related U.S. Application Data

(63) Continuation of application No. 16/111,861, filed on Aug. 24, 2018.

(51) Int. Cl.
| | |
|---|---|
| F28F 13/18 | (2006.01) |
| H05K 13/02 | (2006.01) |
| H05K 7/20 | (2006.01) |
| H05K 1/02 | (2006.01) |
| F28F 21/08 | (2006.01) |
| B64G 1/50 | (2006.01) |

(52) U.S. Cl.
CPC ......... *H05K 1/0212* (2013.01); *F28F 21/084* (2013.01); *F28F 21/085* (2013.01); *H05K 1/0203* (2013.01); *B64G 1/50* (2013.01); *F28F 2245/06* (2013.01); *F28F 2275/068* (2013.01); *H05K 2201/066* (2013.01)

(58) Field of Classification Search
CPC ........ F28F 21/081; F28F 23/00; F28F 21/084; F28F 21/085; F28F 2245/06; F28F 2275/068; H05K 1/0212; H05K 1/0201; H05K 1/0203; H05K 2201/066; B64G 1/50
See application file for complete search history.

(56) References Cited

U.S. PATENT DOCUMENTS

| | | | |
|---|---|---|---|
| 6,167,169 A | 12/2000 | Brinkman et al. | |
| 6,251,706 B1 | 6/2001 | Paniccia | |
| 8,522,049 B1 | 8/2013 | Ahmadi | |
| 2003/0117776 A1 | 6/2003 | Katsuro et al. | |
| 2003/0133118 A1* | 7/2003 | Braig | A61B 5/14532 356/432 |
| 2004/0133084 A1 | 7/2004 | Rule et al. | |
| 2008/0138088 A1 | 6/2008 | Perkins et al. | |
| 2008/0258067 A1 | 10/2008 | Vogtmeier et al. | |
| 2013/0094148 A1* | 4/2013 | Sloane | H05K 1/0212 361/708 |
| 2013/0180973 A1* | 7/2013 | White | H05B 3/28 219/209 |
| 2013/0182444 A1 | 7/2013 | Oestergaard et al. | |
| 2014/0102686 A1* | 4/2014 | Yu | F28F 9/00 165/185 |
| 2015/0173173 A1* | 6/2015 | Ragg | H05K 1/0212 361/736 |

(Continued)

*Primary Examiner* — Jayprakash N Gandhi
*Assistant Examiner* — Michael A Matey
(74) *Attorney, Agent, or Firm* — Botos Churchill IP Law LLP

(57) ABSTRACT

A heat transfer system includes a first component formed of a thermally conductive material and a second component including a surface adapted to capture stray photons to provide heat to the electronic device. The first component is secured and thermally coupled with an electronic device. In particular, the first component includes first and second layers. The first component is in superposed relation with the second component.

20 Claims, 1 Drawing Sheet

(56) References Cited

U.S. PATENT DOCUMENTS

| | | |
|---|---|---|
| 2015/0245481 A1 | 8/2015 | Brunner et al. |
| 2016/0010843 A1 | 1/2016 | Hattori et al. |
| 2016/0249445 A1 | 8/2016 | Min et al. |
| 2018/0092198 A1 | 3/2018 | Armani et al. |
| 2019/0006192 A1 | 1/2019 | Or-Bach et al. |
| 2019/0064006 A1 | 2/2019 | Chow et al. |

* cited by examiner

COMBINED HEAT SINK AND PHOTON HARVESTOR

CROSS-REFERENCE TO RELATED APPLICATIONS

The present application is a continuation of U.S. patent application Ser. No. 16/111,861, filed Aug. 24, 2018, the entire disclosure of which is incorporated herein by reference.

BACKGROUND

Technical Field

The present disclosure relates to a heat transfer system and, more particularly, to a heat transfer system for use with electronic devices operable in a wide range of temperatures.

Background

Electronic devices have long been used in industrial applications, and many techniques have been developed to accommodate the electronic devices in various operating environments. However, one of the important factors to consider in building an electronic device is the wide range of operating temperatures. For example, in an environment such as, e.g., the stratosphere, the electronic device must operate in a range of about 200 degrees Celsius. For example, the electronic device must start in temperatures as low as −100 degrees Celsius, while still being operable in temperatures as high as 100 degrees Celsius.

As the electronic device is exposed to a wide range of extreme temperatures, it is crucial to provide adequate heat to the electronic device to ensure that the electronic device is within the range of operating temperatures, while dissipating excess heat to inhibit overheating of the electronic device in order to keep the electronic device sound and minimize damage to the electronic device. However, this is challenging because electronic devices in extreme range of operating temperatures often require a passive device in order to achieve mission-critical power budget targets. However, passive heat transfer systems typically work for a fairly steady-state heat flux.

Therefore, a continuing need exists for a heat transfer system that works with current electronic devices to overcome usability challenges associated with extreme range of operating temperatures without impairing the performance requirements.

SUMMARY

The present disclosure describes a heat transfer system that demonstrates a practical approach to meeting the performance requirements and overcoming usability challenges associated with electronics devices in an extreme range of operating temperatures. In accordance with an embodiment of the present disclosure a heat transfer system includes a first component formed of a thermally conductive material and a second component including a surface adapted to capture stray photons to provide heat to the electronic device. The first component is secured and thermally coupled with an electronic device. The first component includes first and second layers. The first component is in superposed relation with the second component.

In an embodiment, the first component may be formed of a material having thermal conductivity greater than about 200 W/(m*K).

In another embodiment, the first component may be formed of metal.

In an embodiment, the first layer may be formed of a first material and the second layer may be formed of a second material different from the first material.

In another embodiment, the first layer of the first component may be formed of copper.

In yet another embodiment, the second layer may be formed of aluminum. The first layer of the first component may be in superposed relation with the second layer.

In yet another embodiment, the first and second layers may be explosion bonded to each other.

In still yet another embodiment, the second layer of the first component may be formed of a material having thermal conductivity of about 222 W/(m*K).

In still yet another embodiment, the second layer of the first component may be formed of a material configured to provide structural integrity to the first component in order to retain a shape of the first component.

In still yet another embodiment, the second component may include a surface having surface emissivity of about −0.9.

In an embodiment, the second component may include a white surface.

In another embodiment, the first layer may be integrally formed as a single construct.

In yet another embodiment, the heat transfer system may be a passive heat transfer system.

In accordance with another embodiment of the present disclosure, there is provided a passive heat transfer system including a first layer monolithically formed of a thermally conductive material having thermal conductivity greater than about 200 W/(m*K) and a second layer including a surface adapted to capture stray photons to provide heat to the electronic device. The first layer is secured and thermally coupled with an electronic device. The first layer is in superposed relation with the second layer.

In an embodiment, the first component may be configured to serve as a heat sink.

In another embodiment, the electronic device may be a printed circuit board assembly.

In still another embodiment, the first layer may be formed of aluminum.

DESCRIPTION OF THE DRAWINGS

The foregoing objects, features and advantages of the disclosure will become more apparent from a reading of the following description in connection with the accompanying drawings, in which.

DETAILED DESCRIPTION

Figure 1:
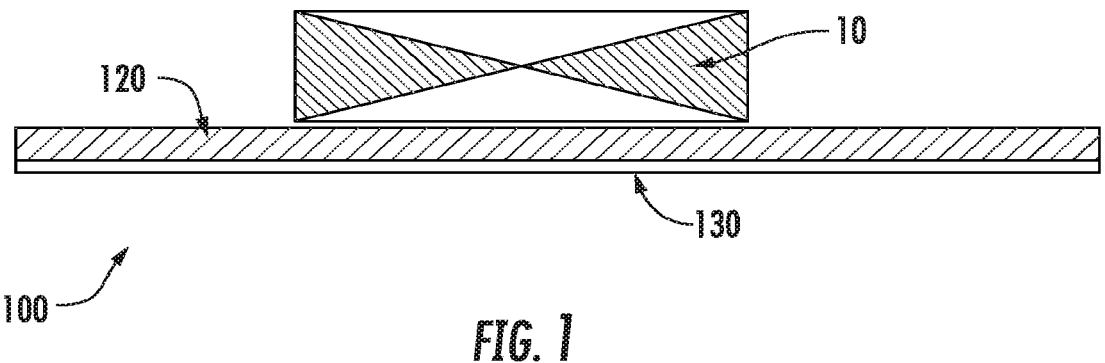
FIG. 1 is a schematic cross-sectional view of a heat transfer system in accordance with an embodiment of the present disclosure.

Embodiments of the present heat transfer system will now be described in detail with reference to the drawings, in which like reference numerals designate identical or corresponding elements in each of the several views. In the following description, well-known functions or constructions are not described in detail to avoid obscuring the present disclosure in unnecessary detail.

With reference to FIG. 1, an embodiment of the present disclosure is generally shown as a heat transfer system 100. The heat transfer system 100 is particularly adapted for use with devices operating in a wide range of temperatures. The heat transfer system 100 is a passive system that may buffer and dissipate heat, which may be critical to a variable-power system that requires mission-critical power budget targets. The heat transfer system 100 may also be configured for use with devices operating under steady state heat flux.

The heat transfer system 100 is configured to effectively harvest stray photons that bounce off the surface of the earth. In particular, by utilizing the heat transfer system 100, the photons may be harvested to capture the heat generated by infrared radiation that may be used to provide "survival heat" to a variety of devices and mechanisms. The devices and mechanisms may include an electronic device such as, e.g., a printed circuit board assembly, generally shown as 10 in FIG. 1. Basic components of the printed circuit board assembly 10 will not be described herein, as the internal construction of the printed circuit board assembly is well known in the art. It is contemplated that the heat transfer system 100 may be used with other devices that may benefit from the heat captured from the infrared radiation.

With continued reference to FIG. 1, the heat transfer system 100 includes a first layer 120 having a metal plate that is configured to be secured to the printed circuit board assembly 10, and a second layer 130 having a high surface emissivity in the infrared regime in order to capture the stray photons bouncing off the surface of the earth (albedo). In addition, the first layer 120 may be formed of a material having suitable thermal conductivity and heat capacity, such that the heat transfer system 100 may also serve as a heat sinking device. The first layer 120 may be formed of a highly thermally conductive material having thermal conductivity of, e.g., greater than 200 W/(m*K). In this manner, the heat transfer system 100 may be utilized to provide "survival heat" to the printed circuit board assembly 10 when the printed circuit board assembly 10 is in an environment, in which, the ambient temperature is near or below the lower bound of the operating temperature, while meeting the requirements of the heat dissipation of the printed circuit board assembly 10 when the printed circuit board assembly 10 is near or above the upper bound of the operating temperature. Under such a configuration, both heat generation and heat dissipation are effected by a single unified thermal solution to keep the printed circuit board assembly 10 warm enough during, e.g., cold nights in the stratosphere, while also meeting the heat dissipation requirements of the printed circuit board assembly 10 that gets hot during operation (e.g. a motor controller). For example, the first layer 120 may be formed of aluminum 1050 or 1100 H0 with thermal conductivity of about 222 W/(m*K), rather than a more common aluminum from the 6000 series having thermal conductivity of about 167 W/(m*K).

The second layer 130 is adapted to capture the stray photons bouncing off the surface of the earth (albedo). For example, the second layer 130 may include, e.g., a painted, white surface having a high surface emissivity in the infrared regime of, e.g., about −0.9. While a highly emissive surface, e.g., in the stratosphere, would cause the surface of the device to reject heat to the environment, the heat transfer system 100 may be highly directional and pointed at the relatively warm surface of the earth, and thus, the highly emissive surface may be used. The first layer 120 secured with the printed circuit board assembly 10 may be in superposed relation with the second layer 130.

In this manner, the heat transfer system 100 may accommodate a device having mission-critical power budget targets, without limiting the device to a steady-state heat flux type, as typically required by most passive heat transfer systems. The heat transfer system 100 enables devices such as, e.g., the printed circuit board assembly 10, to tolerate much wider operational swings such that, e.g., a higher power motor controller, can turn on and off without overheating or freezing in extreme temperature environment such as in, e.g. stratospheric conditions.

Figure 2:
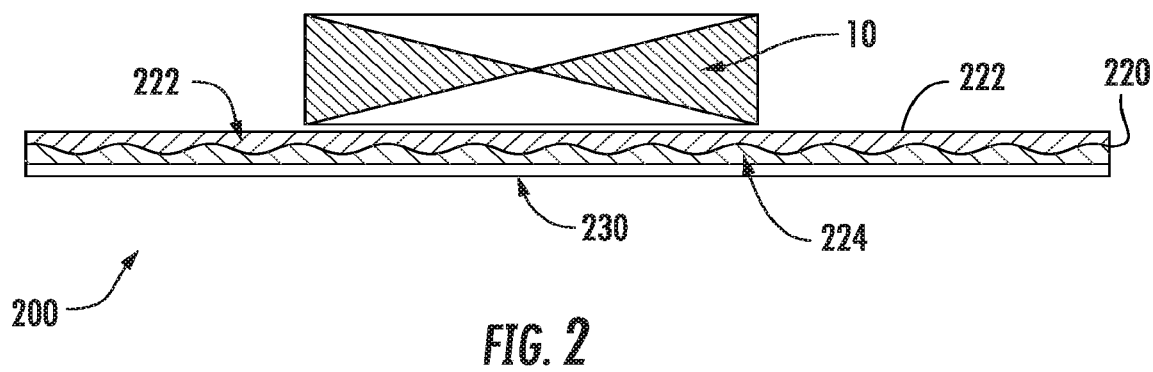
FIG. 2 is a schematic cross-sectional view of a heat transfer system in accordance with another embodiment of the present disclosure.

With reference to FIG. 2, a heat transfer system in accordance with another embodiment of the present disclosure is generally shown as 200. As described hereinabove with respect to the heat transfer system 100, the heat transfer system 200 is also particularly adapted for use with devices operating in a wide range of operating temperatures. The heat transfer system 200 is also a passive system that may buffer and dissipate heat, which may be critical to a variable-power system that requires mission-critical power budget targets.

The heat transfer system 200 is configured to effectively harvest stray photons that bounce off the surface of the earth. In particular, by utilizing the heat transfer system 200, the photons may be harvested to capture the heat generated by infrared radiation, which may be used to provide "survival heat" to a variety of devices and mechanisms including the printed circuit board assembly 10.

The heat transfer system 200 includes a first component 220 having a metal plate that is configured to be secured to the printed circuit board assembly 10, and a second component 230 having a high surface emissivity in the infrared regime in order to capture the stray photons bouncing off the surface of the earth (albedo). The first component 220 may be formed of a highly thermally conductive material having thermal conductivity of, e.g., greater than 200 W/(m*K). The first component 220 is thermally coupled to the printed circuit board assembly 10. In addition, the first component 220 may be formed of a material having suitable thermal conductivity and heat capacity, such that the heat transfer system 200 may also serve as a heat sinking device.

The first component 220 may include a copper layer 222 and an aluminum layer 224. The copper layer 222 is in superposed relation with the aluminum layer 224 and is configured to be secured with the printed circuit board assembly 10. For example, the copper layer 222 may be explosion bonded to the aluminum layer 224 and/or the aluminum layer 224 may be explosion bonded to copper layer 222. For example, the first layer 120 may be formed of aluminum 1050 or 1100 H0 with thermal conductivity of about 222 W/(m*K). Under such a configuration, the heat transfer system 200 having the dual layered first component 220 provides a higher heat capacity than the heat transfer system 100 having the monolithically formed first layer 120. In particular, the explosion bonded copper layer 222 yields significantly higher heat capacity than the first layer 120 of the heat transfer system 100. However, the aluminum layer 224 bonded to the copper layer 222 provides structural integrity to the first component 220 to thereby retain, e.g., the shape of the first component 220. It is further contemplated that other mechanical or thermal coupling may be used to bond the copper layer 222 and the aluminum layer 224.

In this manner, the heat transfer system 200 may be utilized to provide "survival heat" to the printed circuit board assembly 10 when the printed circuit board assembly 10 is in an environment where the printed circuit board assembly 10 is near or below the lower bound of the operating temperature, while meeting the requirements of the heat dissipation of the printed circuit board assembly 10 when the printed circuit board assembly 10 is near or above the upper bound of the operating temperature. Under such a configuration, heat generation and heat dissipation are effected by a single unified thermal solution to keep the printed circuit board assembly 10 warm enough during, e.g., cold nights in the stratosphere, while also meeting the heat dissipation requirements of the printed circuit board assembly 10 that gets hot during operation (e.g. a motor controller).

The second component 230 of the heat transfer system 200 may be substantially identical to the second layer 130 of the heat transfer system 100. The second component 230 is adapted to capture the stray photons bouncing off the surface of the earth (albedo). For example, the second component 230 may include, e.g., a painted, white surface having a high surface emissivity in the infrared regime of, e.g., about –0.9. While a highly emissive surface, e.g., in the stratosphere, would cause the surface of the device to reject heat to the environment, the heat transfer system 200 may be highly directional and pointed at the relatively warm surface of the earth, and thus, the highly emissive surface may be used. The first component 220 secured with the printed circuit board assembly 10 may be in superposed relation with the second component 230.

In this manner, the heat transfer system 200 may accommodate devices having mission-critical power budget targets, without limiting the device to a steady-state heat flux type, as required by typical passive heat transfer systems. The heat transfer system 200 enables the devices such as, e.g., the printed circuit board assembly 10, to tolerate much wider operational swings such that a higher power motor controller may turn on and off without overheating or freezing in extreme temperatures such as in, e.g., stratospheric conditions.

Persons skilled in the art will understand that the structures and methods specifically described herein and shown in the accompanying figures are non-limiting exemplary embodiments, and that the description, disclosure, and figures should be construed merely as exemplary of particular embodiments. For example, while the first and second layers 222, 224 of the heat transfer system 200 are described as being formed of copper and aluminum, respectively, it is contemplated that other materials may be used. It is to be understood, therefore, that the present disclosure is not limited to the precise embodiments described, and that various other changes and modifications may be effected by one skilled in the art without departing from the scope or spirit of the disclosure.

Additionally, the elements and features shown or described in connection with certain embodiments may be combined with the elements and features of certain other embodiments without departing from the scope of the present disclosure, and that such modifications and variations are also included within the scope of the present disclosure. Accordingly, the subject matter of the present disclosure is not limited by what has been particularly shown and described.

The invention claimed is:

1. A passive heat transfer system for use with a stratospheric platform, the heat transfer system comprising:
    a first component formed of a thermally conductive material, the first component having a first surface and a second surface, the first surface of the first component being secured and thermally coupled with an electronic device of a platform configured to operate in the stratosphere; and
    a second component adapted to capture stray photons to provide heat to the electronic device, the second component having a first surface and a second surface, the first surface of the second component being arranged to capture the stray photons and the second surface of the second component being secured to the second surface of the first component;
    wherein the first component is adapted to passively heat the electronic device from the captured stray photons when an ambient temperature of the platform is below an operating temperature of the electronic device.

2. The heat transfer system of claim 1, wherein the first surface of the second component is oriented to collect photons primarily emanating from a surface of the earth.

3. The heat transfer system of claim 1, wherein the heat transfer system is configured to provide survival heat to the electronic device during nighttime in the stratosphere.

4. The heat transfer system of claim 1, wherein the first component is adapted to passively provide the heat to the electronic device when the ambient temperature is below a lower bound of the operating temperature of the electronic device.

5. The heat transfer system of claim 1, wherein the first component is further adapted to passively sink heat from the electronic device when the electronic device is above an upper bound of the operating temperature of the electronic device.

6. The heat transfer system of claim 1, further comprising the electronic device.

7. The heat transfer system of claim 6 wherein the electronic device includes a printed circuit board assembly.

8. The heat transfer system of claim 6 wherein the electronic device comprises a motor controller.

9. The heat transfer system of to claim 1, wherein the first component is formed of metal.

10. The heat transfer system of claim 1, wherein the thermally conductive material of the first component comprises a first thermally conductive material and a second thermally conductive material different from the first thermally conductive material.

11. The heat transfer system of claim 10, wherein the first thermally conductive material is a first metal and the second thermally conductive material is a second metal.

12. The heat transfer system of claim 11, wherein the first metal is copper.

13. The heat transfer system of claim 12, wherein the second metal is aluminum.

14. The heat transfer system of claim 11, wherein the first and second metals are explosion bonded to each other.

15. The heat transfer system of claim 1, wherein the heat transfer system is configured to buffer heat captured by the second component.

16. The heat transfer system of claim 1, wherein the ambient temperature is in a temperature range of about 200° C. in the stratosphere.

17. The heat transfer system of claim 1, wherein the ambient temperature is between –100° C. to 100° C.

18. The heat transfer system of claim 1, wherein the first surface of the second component has an emissivity of about 0.9.

19. The heat transfer system of claim 1, wherein the first surface of the second component has an emissivity in the infrared range.

20. The heat transfer system of claim 1, wherein the thermally conductive material of the first component has a thermal conductivity exceeding 200 W/(m*K).

\* \* \* \* \*